(12) United States Patent
Kobori et al.

(10) Patent No.: US 8,913,855 B2
(45) Date of Patent: Dec. 16, 2014

(54) GETTING-ON/OFF DETERMINATION APPARATUS AND GETTING-ON/OFF DETERMINATION METHOD

(75) Inventors: Norimasa Kobori, Nagoya (JP); Takahiro Nakayama, Nagoya (JP); Kazuhiro Mima, Toyota (JP); Hitoshi Yamada, Aichi-gun (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 195 days.

(21) Appl. No.: 13/511,579

(22) PCT Filed: Aug. 27, 2010

(86) PCT No.: PCT/JP2010/005295
§ 371 (c)(1),
(2), (4) Date: May 23, 2012

(87) PCT Pub. No.: WO2012/025969
PCT Pub. Date: Mar. 1, 2012

(65) Prior Publication Data
US 2012/0243822 A1      Sep. 27, 2012

(51) Int. Cl.
*G02B 6/00*         (2006.01)
*A63C 3/00*         (2006.01)
*B62K 3/00*         (2006.01)
*H03K 17/968*       (2006.01)

(52) U.S. Cl.
CPC .... *H03K 17/968* (2013.01); *H03K 2217/94104* (2013.01); *B62K 3/007* (2013.01)
USPC .......................................................... 385/13

(58) Field of Classification Search
CPC ............................. G01B 11/002; B60N 2/002
USPC .............................................. 385/13; 701/45
See application file for complete search history.

(56) References Cited

U.S. PATENT DOCUMENTS

| | | | |
|---|---|---|---|
| 7,619,226 B2* | 11/2009 | Beinhocker | 250/474.1 |
| 2005/0006151 A1* | 1/2005 | Mattson et al. | 177/1 |

(Continued)

FOREIGN PATENT DOCUMENTS

| | | |
|---|---|---|
| JP | 61-034493 A | 2/1986 |
| JP | 1-105418 A | 4/1989 |

(Continued)

OTHER PUBLICATIONS

International Search Report mailed Nov. 9, 2010 of PCT/JP2010/005295.

(Continued)

*Primary Examiner* — Eric Wong
(74) *Attorney, Agent, or Firm* — Kenyon & Kenyon LLP (57) ABSTRACT

A getting-on/off determination apparatus determines rider's getting-on/off for an inverted two-wheel vehicle that travels while maintaining the inverted state. The getting-on/off determination apparatus includes an optical fiber laid in a step portion that a rider gets on/off, a light emitting unit that emits detection light and is connected to one end of the optical fiber, a light receiving unit that receives the detection light emitted from the light emitting unit and is connected to another end of the optical fiber, at least one transmitted light varying portion that varies an amount of transmitted light of the detection light passing through the optical fiber in conjunction with a vertical displacement of the step portion that occurs when the rider gets on/off the inverted two-wheel vehicle, and a determination unit that determines getting-on/off of the rider based on an amount of the detection light received by the light receiving unit.

7 Claims, 8 Drawing Sheets

(56) References Cited

U.S. PATENT DOCUMENTS

| | | | |
|---|---|---|---|
| 2011/0029204 A1* | 2/2011 | Jaramillo et al. | 701/45 |
| 2012/0203117 A1* | 8/2012 | Chen et al. | 600/484 |

FOREIGN PATENT DOCUMENTS

| | | |
|---|---|---|
| JP | 02-298911 A | 12/1990 |
| JP | 07-243874 A | 9/1995 |
| JP | 2001-216863 A | 8/2001 |
| JP | 2004-510637 A | 4/2002 |
| JP | 2010-030438 A | 2/2010 |
| JP | 2010-030569 A | 2/2010 |
| JP | 2010-119422 A | 6/2010 |

OTHER PUBLICATIONS

Japanese Patent Office, English translation of the relevant part of the Office Action in related Japanese Application No. 2012-530428, dated May 14, 2013.

* cited by examiner

GETTING-ON/OFF DETERMINATION APPARATUS AND GETTING-ON/OFF DETERMINATION METHOD

This is a 371 national phase application of PCT/JP2010/005295 filed 27 Aug. 2010, the contents of which are incorporated herein by reference.

TECHNICAL FIELD

The present invention relates to a getting-on/off determination apparatus and a getting-on/off determination method to determine rider's getting-on/off for an inverted two-wheel vehicle that travels while maintaining the inverted state.

BACKGROUND ART

In recent years, the development of inverted two-wheel vehicles that travel while maintaining the inverted state has been under way. Because of their characteristic feature that they need to maintain the inverted state, it is important to determine the getting-on/off of the rider in consideration of the safety and the like. For example, a getting-on/off determination apparatus that determines rider's getting-on/off for an inverted two-wheel vehicle by using a contact-type mechanical switch disposed in the step portion on which the rider stands has been known. This getting-on/off determination apparatus could suffer a durability problem because electric contacts of the mechanical switch are repeatedly brought into a contacted state and an un-contacted state every time a rider gets on/off the inverted two-wheel vehicle.

Further, to solve the problem like this, an inverted two-wheel vehicle using a noncontact-type optical switch in which when the step portion on which the rider stands is displaced downward, a detection light emitted from a light-emitting unit is blocked by the stem of the step portion and the getting-on/off of the rider is determined by detecting the interception of the detection light by using a detection unit has been known (see Patent literature 1).

CITATION LIST

Patent Literature

PTL 1: Published Japanese Translation of PCT International Publication for Patent Application, No. 2004-510637

SUMMARY OF INVENTION

Technical Problem

However, since the electronic devices such as the light emitting unit and the detection unit are disposed near the optical switch disposed below the step portion in the above-described inverted two-wheel vehicle, it could suffer a problem in terms of the durability such as waterproof property and dustproof property.

The present invention has been made in view of the problem like this, and its main object is to provide a getting-on/off determination apparatus and a getting-on/off determination method having improved durability.

Solution to Problem

An aspect of the present invention, which has been made to achieve the above-mentioned object, is a getting-on/off determination apparatus that determines rider's getting-on/off for an inverted two-wheel vehicle that travels while maintaining an inverted state, including: an optical fiber laid in a step portion that a rider gets on/off; a light emitting unit that emits detection light, the light emitting unit being connected to one end of the optical fiber; a light receiving unit that receives the detection light emitted from the light emitting unit, the light receiving unit being connected to another end of the optical fiber; at least one transmitted light varying portion that varies an amount of transmitted light of the detection light that passes through the optical fiber in conjunction with a vertical displacement of the step portion that occurs when the rider gets on/off the inverted two-wheel vehicle; and a determination unit that determines getting-on/off of the rider based on an amount of the detection light received by the light receiving unit.

Further, another aspect of the present invention, which has been made to achieve the above-mentioned object, is a getting-on/off determination method to determine rider's getting-on/off for an inverted two-wheel vehicle that travels while maintaining an inverted state, including: a step of emitting detection light from one end of an optical fiber laid in a step portion that a rider gets on/off; a step of receiving the emitted detection light from another end of the optical fiber; a step of varying an amount of transmitted light of the detection light within the optical fiber in conjunction with a vertical displacement of the step portion that occurs when the rider gets on/off the inverted two-wheel vehicle; and a step of determining getting-on/off of the rider based on a received amount of the detection light.

Advantageous Effects of Invention

According to the present invention, it is possible to provide a getting-on/off determination apparatus and a getting-on/off determination method having improved durability.

DESCRIPTION OF EMBODIMENTS

Figure 1:
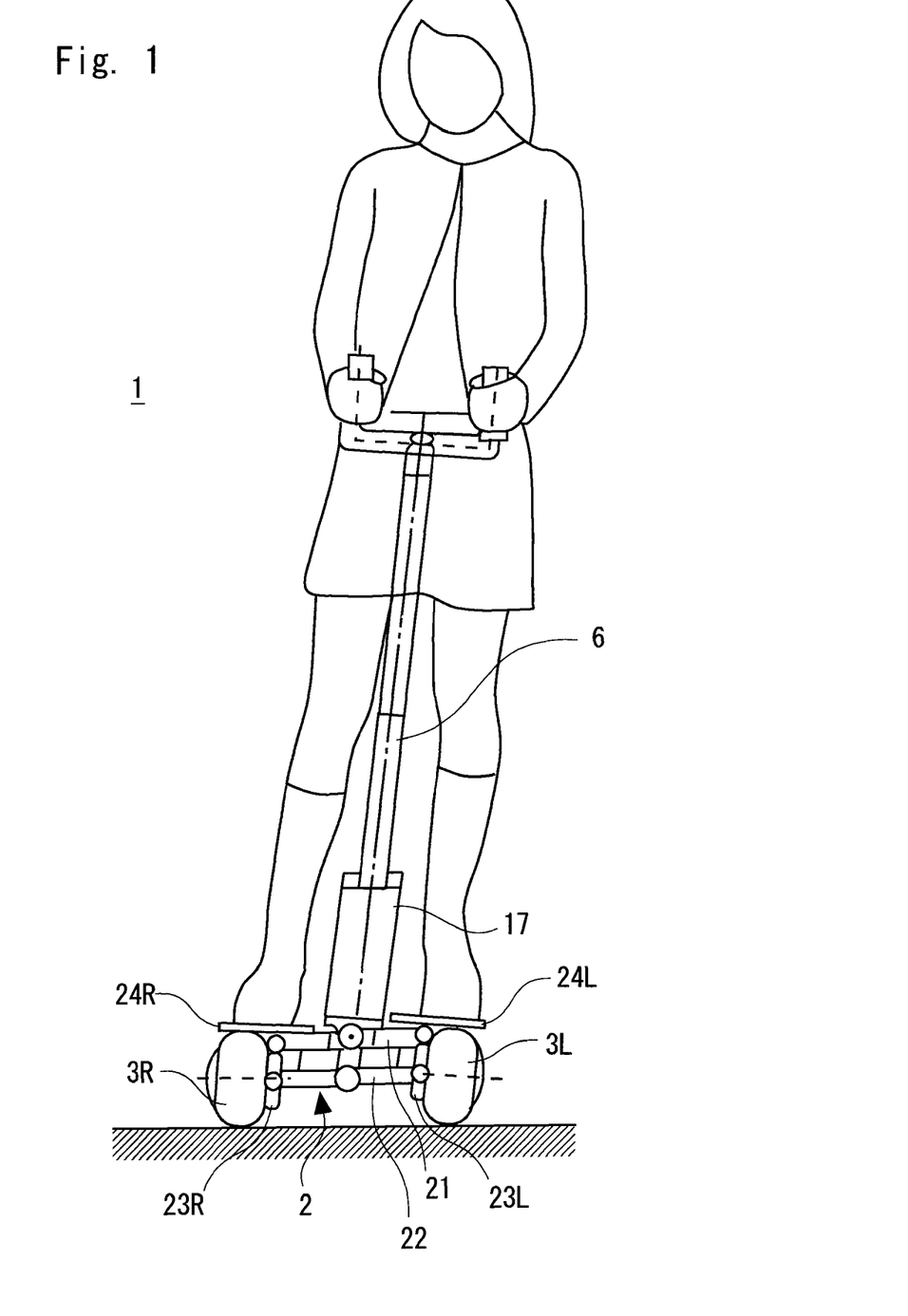
FIG. 1 is a front view showing a general configuration of an inverted two-wheel vehicle according to an exemplary embodiment of the present invention.
Figure 2:
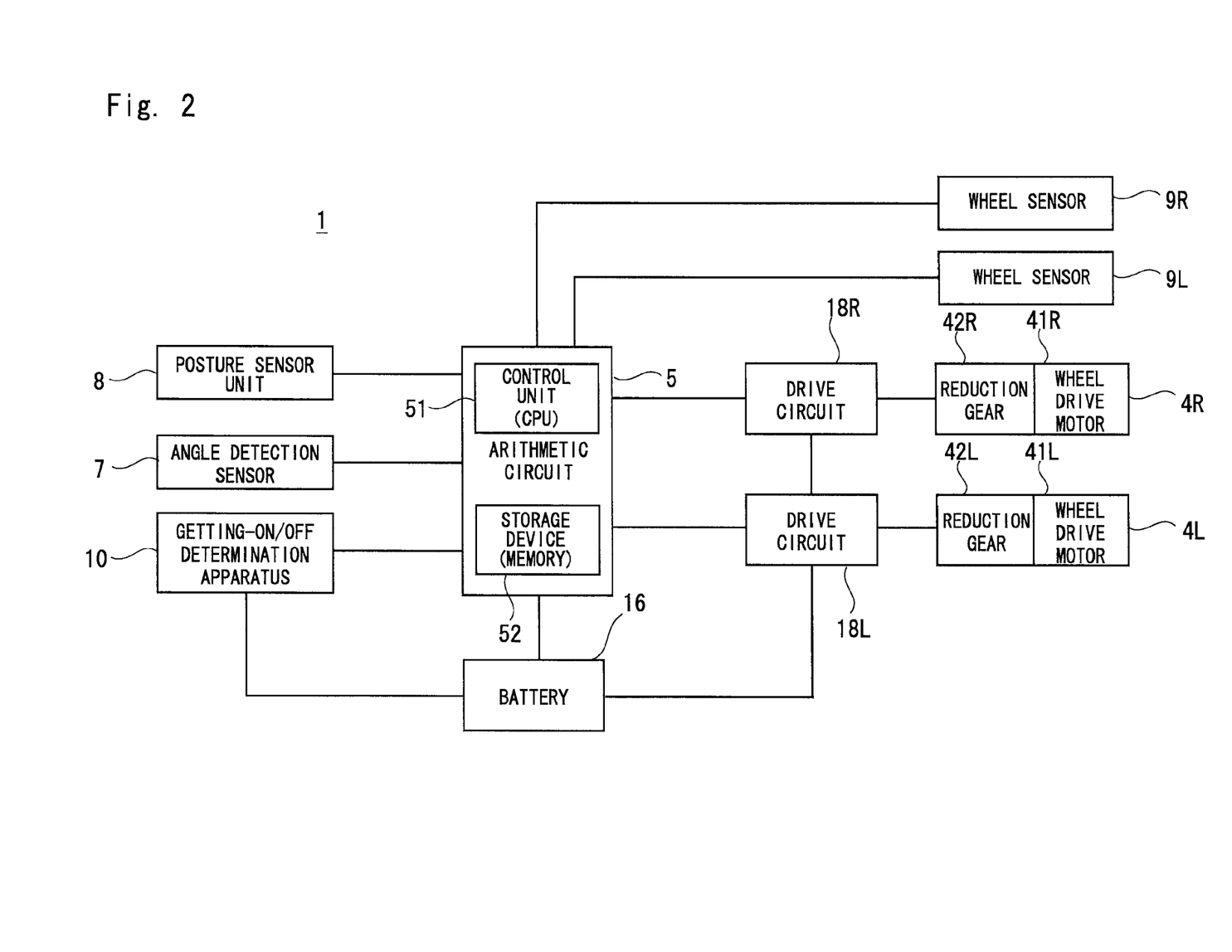
FIG. 2 is a block diagram showing a general system configuration of an inverted two-wheel vehicle according to an exemplary embodiment of the present invention.

Exemplary embodiments according to the present invention are explained hereinafter with reference to the drawings. FIG. 1 is a front view showing a general configuration of an inverted two-wheel vehicle according to an exemplary embodiment of the present invention. Further, FIG. 2 is a block diagram showing a general system configuration of the inverted two-wheel vehicle according to this exemplary embodiment.

An inverted two-wheel vehicle 1 according to this exemplary embodiment performs a desired traveling action while maintaining the inverted state. The inverted two-wheel vehicle 1 includes a vehicle main body 2, a pair of left and right driving wheels 3L and 3R rotatably mounted to the vehicle main body 2, a pair of wheel drive units 4L and 4R that rotationally drive the respective driving wheels 3L and 3R, a control unit 5 that controls both of the wheel drive units 4L and 4R, an operation handle 6 operably mounted to the vehicle main body 2, and a getting-on/off determination apparatus 10 that determines the getting-on/off of a rider.

The operation handle 6 is an operation unit. By inclining this operation unit in a forward/backward direction, the inverted two-wheel vehicle 1 performs a forward or backward movement. Further, by inclining the operation unit in a roll direction, the inverted two-wheel vehicle 1 performs a turning movement. Note that the roll axis is an axis that passes through the center of the vehicle main body 2 and is in parallel with the traveling direction of the inverted two-wheel vehicle 1.

The pair of the driving wheels 3L and 3R are coaxially arranged on both sides of the vehicle main body 2 in the direction perpendicular to the traveling direction, and are rotatably supported on the vehicle main body 2.

The vehicle main body 2 is constructed, for example, as a parallel linkage composed of vertically-arranged mutually-parallel vehicle body upper member 21 and vehicle body lower member 22, and a pair of mutually-parallel side members 23L and 23R that are arranged in a left-right direction and rotatably connected to the vehicle body upper member 21 and vehicle body lower member 22.

The wheel drive units 4L and 4R are mounted to the respective exterior surfaces of the pair of side members 23L and 23R. The wheel drive units 4L and 4R can independently and rotationally drive the pair of driving wheels 3L and 3R. Each of the wheel drive units 4L and 4R can be composed of, for example, a wheel drive motor (41L, 41R) and a reduction gear(s) (42L, 42R) that is coupled to the rotation shaft of the wheel motor (41L, 41R) in such a manner that the power can be transferred from the rotation shaft to the reduction gear.

An angle detection sensor 7 that detects operation information (such as an operation amount and an operation direction) of the operation handle 6 is attached to the vehicle main body 2. For example, a potentiometer, a sensor having a variable-capacitor structure, or the like can be used as the angle detection sensor 7. The angle detection sensor 7 is connected to the control unit 5 and thereby outputs the detected operation information of the operation handle 6 to the control unit 5.

The vehicle main body 2 is provided with a posture sensor unit 8 that detects posture information such as a pitch angle, a pitch angular speed, and a pitch angular acceleration when the inverted two-wheel vehicle is traveling. The posture sensor unit 8 is composed of, for example, a gyroscopic sensor, an acceleration sensor, and the like. When the rider inclines the operation handle 6 forward or backward, the vehicle main body 2 will incline in the same direction. This posture sensor unit 8 detects a pitch angle, a pitch angular speed, a pitch angular acceleration, and the like corresponding to this inclination. The posture sensor unit 8 is connected to the control unit 5 and thereby outputs the detected posture information to the control unit 5.

A pair of wheel sensors 9L and 9R that detect rotation information (such as a rotation angle, a rotation speed, and a rotation acceleration) of the respective driving wheels 3L and 3R are provided in the axles of the respective driving wheels 3L and 3R. Each of the wheel sensors 9L and 9R is connected to the control unit 5 and thereby outputs the detected rotation information to the control unit 5.

On the upper surface of the vehicle main body 2, a pair of step portions 24L and 24R are provided on the left and right sides of the operation handle 6. Each of the step portions 24L and 24R is a plate member. The rider puts one foot on one of the step portions 24L and 24R and the other foot on the other of the step portions 24L and 24R when the rider gets on the vehicle.

Figure 3:
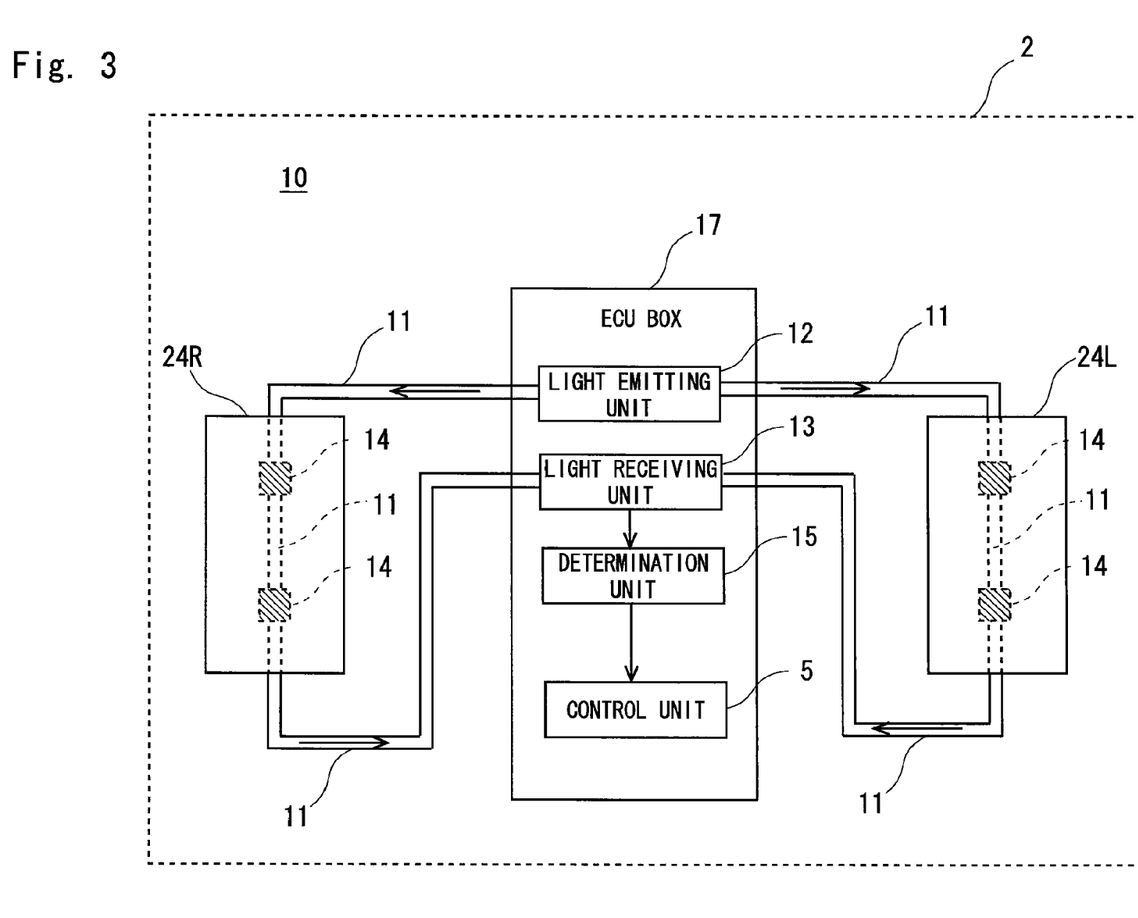
FIG. 3 is a block diagram showing a general system configuration of a getting-on/off determination apparatus according to an exemplary embodiment of the present invention.

The getting-on/off determination apparatus 10 is disposed in the vehicle main body 2, and is capable of determining rider's getting-on/off for each of the step portions 24L and 24R. FIG. 3 is a block diagram showing a general system configuration of the getting-on/off determination apparatus according to this exemplary embodiment. The getting-on/off determination apparatus 10 includes an optical fiber 11 laid in each of the step portions 24L and 24R, a light emitting unit 12 that emits detection light, a light receiving unit 13 that receives the detection light, a transmitted light varying portion 14 that varies an amount of transmitted light of the detection light that passes through the optical fiber 11, and a determination unit 15 that determines the getting-on/off of a rider.

The light emitting unit 12 is connected to one end of the optical fiber 11, and emits detection light to the one end of the optical fiber 11. The light emitting unit 12 is composed of, for example, an optical member(s) such as a condenser lens, an LED(s) (Light Emitting Diode(s)), and so on.

The light receiving unit 13 is connected to the other end of the optical fiber 11, and receives the detection light emitted from the light emitting unit 12, from the other end of the optical fiber 11. The light receiving unit 13 is composed of, for example, an optical member(s) such as a condenser lens, a photodiode(s) (PD(s)), and so on.

The light receiving unit 13 is connected to the determination unit 15 and continuously outputs a light reception signal to the determination unit 15 over the period during which the light receiving unit 13 is receiving at least a predetermined amount of the detection light emitted from the optical fiber 11. On the other hand, when the amount of received detection light emitted from the optical fiber 11 decreases below the predetermined amount, the light receiving unit 13 stops outputting the light reception signal. Note that the above-mentioned predetermined amount is determined in advance based on the amount of the vertical displacement of the transmitted light varying portion 14 in each of the step portions 24L and 24R (which is described later) so that the getting-on/off of a rider can be determined with high accuracy. Further, the apparatus may be configured in such a manner that the above-mentioned predetermined amount can be adjusted by using a correction circuit or the like, so that the getting-on/off determination can be made with higher accuracy by correcting the assembling error, the temperature error, and the like.

The transmitted light varying portion 14 varies the amount of the detection light that passes through the optical fiber 11 in conjunction with the vertical displacement of the respective step portion (24L, 24R) that occurs when a rider gets on/off the inverted two-wheel vehicle. This transmitted light varying portion 14 and a space portion 111 of the optical fiber 11 (which is described later) form an optical switch.

At least one transmitted light varying portion 14 is provided in each of the step portions 24L and 24R. For example, a pair of front and rear transmitted light varying portions 14 are provided along the longitudinal direction in each of the step portions 24L and 24R. However, the number and the position of the transmitted light varying portion(s) 14 provided in each of the step portions 24L and 24R can be arbitrarily determined.

The determination unit 15 determines the getting-on/off of a rider based on the light reception signal supplied from the light receiving unit 13. The light reception signal changes based on the amount of the detection light received by the light receiving unit 13. For example, when the determination unit 15 is receiving the light reception signal from the light receiving unit 13, the determination unit 15 determines that the feet of a rider are off the respective step portions 24L and 24R and thereby that the rider is not on the vehicle. On the other hand, when the determination unit 15 is not receiving the light reception signal from the light receiving unit 13, the determination unit 15 determines that the feet of a rider are placed on the respective step portions 24L and 24R and thereby that the rider is on the vehicle. The determination unit 15 is connected to the control unit 5 and thereby outputs a getting-on/off determination signal (getting-off signal or getting-on signal) of a rider to the control unit 5.

As shown in FIG. 3, each of the optical fibers 11 extending from the light emitting unit 12 is inserted to a respective one of the step portions 24L and 24R and laid in a place where an optical switch is disposed. Meanwhile, each of the optical fibers 11 extending from a respective one of the step portions 24L and 24R is connected to the light receiving unit 13. Note that the connection configuration of the optical fiber 11 shown in FIG. 3 is merely an example. That is, other various connection configurations can be also used.

As described above, by using noncontact-type optical switches for the getting-on/off determination of a rider, this exemplary embodiment has excellent durability in comparison to the contact-type mechanical switches using electric contacts. Further, even when a plurality of optical switches are formed by forming a plurality of space portions 111 on the optical fiber 11 and a plurality of convex portions 241 corresponding to the respective space portions 111 in each of the step portions 24L and 24R, the numbers of necessary light emitting unit 12, light receiving unit 13, and determination unit 15 is only one respectively, thus leading to the cost reduction. Furthermore, since the flexibility of wiring is high, the wiring property is also improved.

Figure 4:
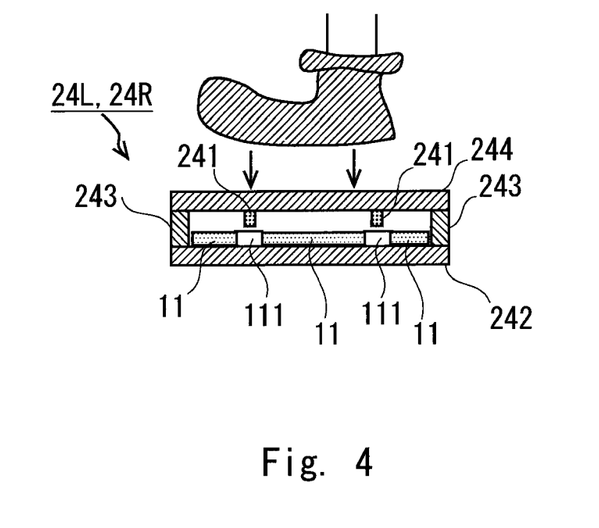
FIG. 4 is a cross section showing an example of a configuration of each step portion according to an exemplary embodiment of the present invention.

FIG. 4 is a cross section showing an example of a configuration of each step portion according to this exemplary embodiment. Each of the step portions 24L and 24R includes a roughly rectangular lower surface member 242 supported on the vehicle main body 2, side members 243 connected to the peripheral edge of the lower surface member 242, and a roughly rectangular upper surface member 244 connected to the upper edge of the side members 243. The upper surface member 244 is opposed to the lower surface member 242 and a rider can put his/her foot on the upper surface member 244.

The upper surface member 244 of each of the step portions 24L and 24R is made of, for example, a rigid member having a certain bending property such as a synthetic resin. Each of the step portions 24L and 24R is configured in such a manner that when a rider's foot is put on the upper surface of the step portion (24L, 24R) and a load is thereby applied on the upper surface, the step portion (24L, 24R) bends downward to a certain degree (FIG. 5), whereas when the rider's foot is detached from the upper surface, the step portion (24L, 24R) restores to the original flat state (FIG. 4). In this manner, when a rider gets on/off the step portions 24L and 24R, the upper surface member 244 of each of the step portions 24L and 24R is deformed and displaced in the vertical direction.

On the under surface of the upper surface member 244 of each of the step portions 24L and 24R, downward-protruding convex portions 241 are formed. The convex portions 241 are merely an example of the above-described transmitted light varying portion 14. Although a pair of front and rear convex portions 241 are formed along the longitudinal direction in each of the step portions 24L and 24R, the shape, the position, and the number of the convex portion(s) disposed in the step portions 24L and 24R can be arbitrarily determined. For example, only one convex portion 241 may be formed roughly at the center of each of the step portions 24L and 24R, or three or more convex portions 241 may be formed. Further, although the convex portions 241 and the upper surface member 244 are formed as separate components, the present invention is not limited to this configuration. That is, the convex portion 241 and the upper surface member 244 may be formed as an integrated component. The above-shown configuration of each of the step portions 24L and 24R is merely an example, and the present invention is not limited to this configuration. That is, other various configurations can be used.

The optical fiber 11 is laid below the convex portions 241 of the upper surface member 244 and above the lower surface member 242. The optical fiber 11 is made of, for example, a thermosetting acrylic resin or the like, and is a linear member composed of a core and a clad made of a fluoroplastic or the like. The clad is integrally formed around the core.

Figure 6:
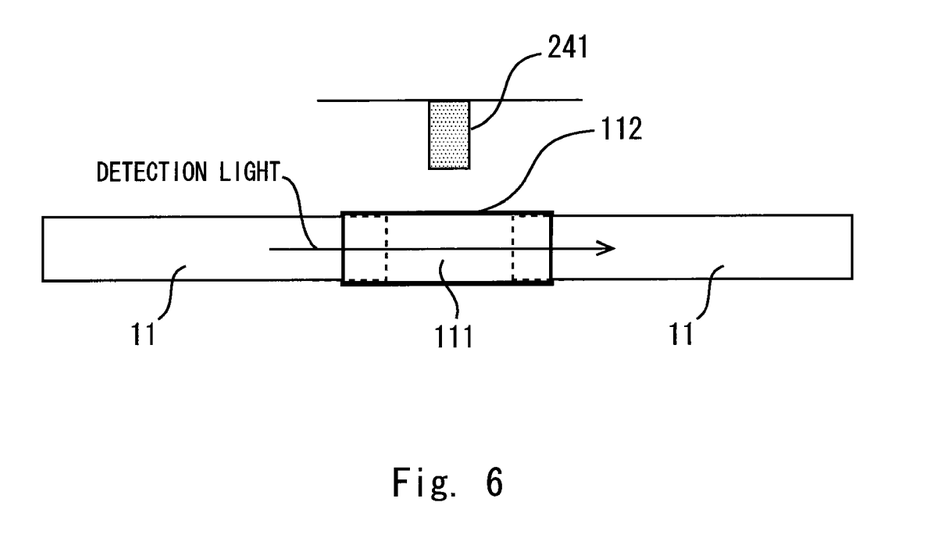
FIG. 6 is an enlarged view showing an enlarged space portion of an optical fiber and an enlarged convex portion on an upper surface member of each step portion.

A plurality of space portions 111 having a predetermined distance are formed in the optical fiber 11. Note that this predetermined distance is set, for example, to such an optimal distance that the loss of the detection light passing through the optical fiber 11 is small and the convex portion 241 can goes into/comes out from the space portion. Each of the space portions 111 of the optical fiber 11 is formed in a place corresponding to a respective one of the convex portions 241 of the upper surface member 244 in each of the step portions 24L and 24R. FIG. 6 is an enlarged view showing an enlarged space portion of the optical fiber and an enlarged convex portion on the upper surface member in each step portion. As shown in FIG. 6, each of the space portions 111 is covered with an elastic member 112 such as rubber.

Note that a shape memory alloy such as a wire-mesh-type spring member, for example, may be used as the elastic member 112. In this way, extremely high durability (e.g., about 1 to 10 million times) is ensured for the contact portion that comes into contact with the convex portion 241. Further, each space portion 111 of the optical fiber 11 may be filled with a resin member such as a silicon resin. In this way, it is possible to prevent the freezing that could otherwise occur inside each space portion 111. Note that although each space portion 111 is covered with the elastic member 112, the present invention is not limited to this configuration. That is, each space portion 111 does not necessarily have to be covered with the elastic member or the like.

When a rider gets on/off the inverted two-wheel vehicle and the upper surface member 244 of each of the step portions 24L and 24R is thereby vertically displaced, each convex portion 241 goes into/comes out from the respective space portion 111 of the optical fiber 11 and thereby varies the amount of transmitted light of the detection light that passes through the optical fiber 11.

Figure 5:
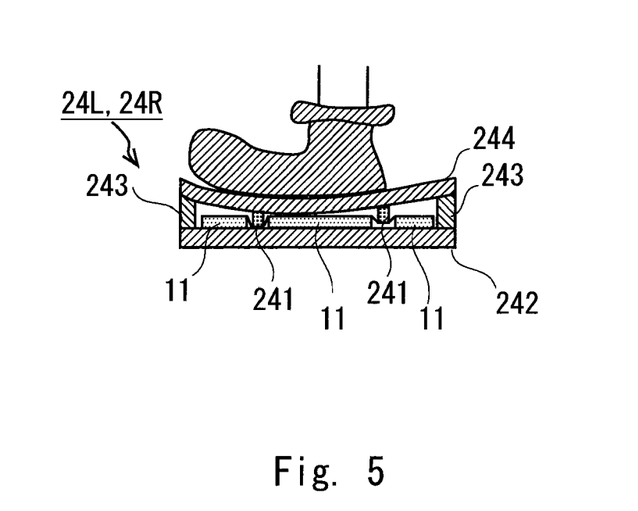
FIG. 5 is a cross section showing an example of a configuration of each step portion according to an exemplary embodiment of the present invention.
Figure 7:
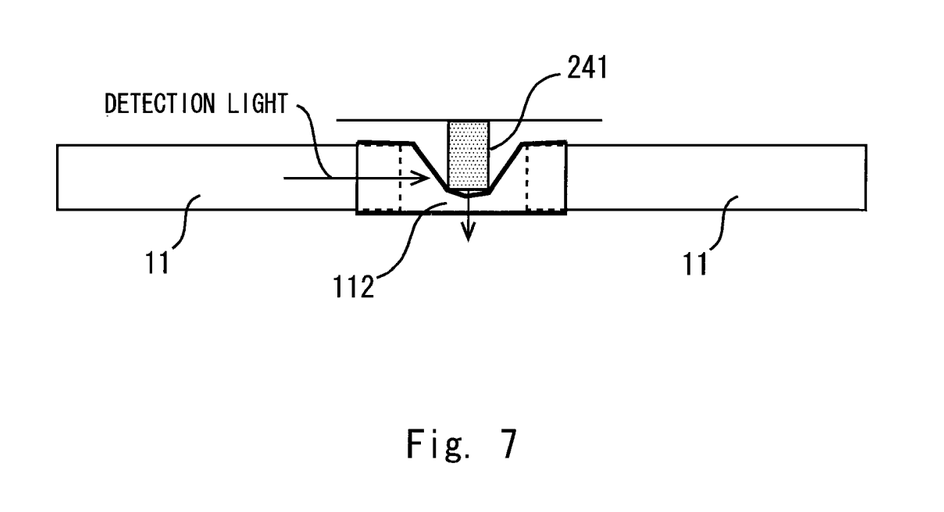
FIG. 7 is an enlarged view showing an enlarged space portion of an optical fiber and an enlarged convex portion on an upper surface member of each step portion.

More specifically, as shown in FIG. 5, when rider's feet are placed on the upper surface members 244 of the respective step portions 24L and 24R and a load is thereby applied on each upper surface member 244, the upper surface member 244 bends downward and each convex portion 241 of the upper surface member 244 thereby moves downward. As a result, each convex portion 241 goes into the respective space portion 111 of the optical fiber 11, and thereby reducing the amount of the detection light that passes through the optical fiber 11. In this state, as shown in FIG. 7, the convex portion 241 goes into the respective space portion 111 while deforming the elastic member 112 of the space portion 111 downward. As a result, the convex portion 241 can reduce the amount of the detection light that passes through the optical fiber 11.

On the other hand, as shown in FIG. 4, when rider's feet are detached from the upper surface members 244 of the respective step portions 24L and 24R and no load is thereby applied on the upper surface members 244, the upper surface member 244 of each of the step portions 24L and 24R restores to the original flat state and each convex portion 241 of the upper surface member 244 thereby retunes upward. As a result, as shown in FIG. 6, each convex portion 241 comes out from the respective space portion 111 of the optical fiber 11. Therefore, the amount of the detection light that passes through the optical fiber 11 increases and returns to the normal transmission amount.

An ECU box 17 is provided in a base portion 61 of the operation handle 6. In the ECU box 17, the above-described light emitting unit 12, the light receiving unit 13, and the determination unit 15 as well as the control unit 5, a battery 16, and other electronic devices are disposed (FIG. 1). This ECU box 17 is hermetically sealed, thus ensuring a dustproof property, a waterproof property, a vibration-proof property, a magnetic-shielding property, and the like. In this way, the durability and the reliability of the devices housed in the ECU box 17 are improved. Note that although the ECU box 17 is disposed in the base portion 61 of the operation handle 6 as described above, the present invention is not limited to this configuration. That is, the ECU box 17 may be disposed in any other places provided that the above-mentioned durability and reliability can be ensured.

As described above, each convex portion 241 of the upper surface member 244 and each space portion 111 of the optical fiber 11 (optical switch) in each of the step portions 24L and 24R, which are used to actually detect the getting-on/off of a rider, are located in a place where dust, moisture, vibrations, electromagnetic waves, and the like are likely to occur. Meanwhile, the light emitting unit 12, the light receiving unit 13, and the determination unit 15 of the getting-on/off determination apparatus 10, which could otherwise easily receive adverse effects from these elements, are housed inside the ECU box 17, which is hermetically sealed and thereby ensures the durability, and located in a place away from the above-described switch portion. Further, by housing these devices collectively in the ECU box 17, the maintenance property is also improved. Furthermore, since the optical switch is connected to the light emitting unit 12 and the light receiving unit 13 through the optical fiber 11, which is less likely to be affected by the above-mentioned dust, moisture, vibrations, electromagnetic waves, and the like, its reliability and the wiring property are higher than those of the conventional electric wiring.

Drive circuits 18L and 18R that drive the pair of wheel drive units 4L and 4R or the like are contained in the vehicle body upper member 21 of the vehicle main body 2 (FIG. 2).

The control unit 5 performs predetermined arithmetic processing based on the posture information supplied from the posture sensor unit 8, the operation information supplied from the angle detection sensor 7, the determination signal supplied from the determination unit 15 of the getting-on/off determination apparatus 10, and the like, and outputs a necessary control signal(s) to each of the wheel drive units 4L and 4R. The control unit 5 controls each of the wheel drive units 4L and 4R in response to a traveling operation made by a rider, and thereby controls the driving of each of the driving wheels 3L and 3R. By doing so, the control unit 5 can move the inverted two-wheel vehicle 1 at a desired speed in a desired direction (e.g., forward movement, backward movement, right turn, left turn, acceleration, deceleration, and standstill) while maintaining the inverted state of the inverted two-wheel vehicle 1.

The control unit 5 includes, for example, an arithmetic circuit 51 including a micro computer (CPU), a storage device 52 including a program memory, a data memory, other RAMs and ROMs, and the like. The battery 16 is connected to each of the control unit 5, the drive circuit 18L, the drive circuit 18R, and the getting-on/off determination apparatus 10, and supplies electric power to them. Note that the above-described configuration of the inverted two-wheel vehicle 1 is merely an example, and the getting-on/off determination apparatus 10 according to this exemplary embodiment can be applied to any inverted two-wheel vehicle that travels while maintain the inverted state.

Figure 8:
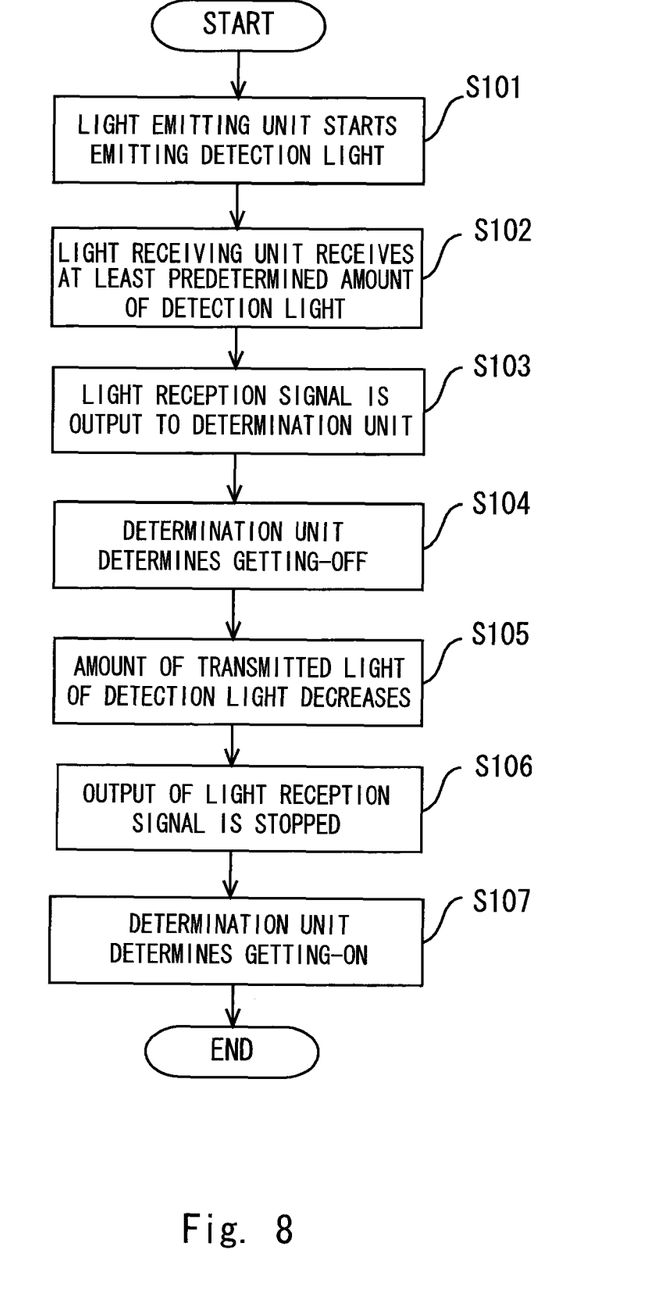
FIG. 8 is a flowchart showing an example of a determination process flow of a getting-on/off determination apparatus according to an exemplary embodiment of the present invention.

Next, a getting-on/off determination method performed by the getting-on/off determination apparatus according to this exemplary embodiment is explained in detail. FIG. 8 is a flowchart showing an example of a determination process flow of the getting-on/off determination apparatus according to this exemplary embodiment.

For example, when a rider performs a certain operation in the inverted two-wheel vehicle 1, the getting-on/off determination apparatus 10 starts up and the light emitting unit 12 starts emitting detection light to one end of the optical fiber 11 (step S101). The detection light emitted to the optical fiber 11 propagates through the optical fiber 11 and the light receiving unit 13 receives at least a predetermined amount of the detection light (step S102).

When the light receiving unit 13 is receiving at least a predetermined amount of the detection light, the light receiving unit 13 outputs a light reception signal to the determination unit 15 (step S103). When the determination unit 15 is receiving the light reception signal from the light receiving unit 13, the determination unit 15 determines that the rider's feet are off the respective step portions 24L and 24R and that the rider is off the vehicle (step S104). Therefore, the determination unit 15 outputs a getting-off signal to the control unit 5.

After that, for example, when the rider starts getting on the vehicle and his/her feet are put on the respective step portions 24L and 24R thus applying a load on each of the step portions 24L and 24R as shown in FIG. 5, the upper surface member 244 of each of the step portions 24L and 24R bends downward and each convex portion 241 of the upper surface member 244 moves downward. As a result, each convex portion 241 goes into the respective space portion 111 of the optical fiber 11 and thereby reducing the amount of the detection light that passes through the optical fiber 11 (step S105).

When the light receiving unit 13 is not receiving at least a predetermined amount of the detection light, the light receiving unit 13 stops outputting the light reception signal (step S106). Further, when the determination unit 15 is not receiving the light reception signal from the light receiving unit 13, the determination unit 15 determines that the rider's feet are placed on the respective step portions 24L and 24R and that the rider is on the vehicle (step S107). Therefore, the determination unit 15 outputs a getting-on signal to the control unit 5.

As described above, in the getting-on/off determination apparatus 10 according to this exemplary embodiment, the transmitted light varying portion 14 of each of the step portions 24L and 24R varies the amount of the detection light that is emitted from the light emitting unit 12 and passes through the optical fiber 11 in conjunction with the vertical displacement of each of the step portions 24L and 24R that occurs when a rider gets on/off the inverted two-wheel vehicle. Further, the determination unit 15 determines the getting-on/off of the rider based on the amount of the detection light received by the light receiving unit 13. In this way, since a noncontact-type optical switch(s) is used for the getting-on/off determination of a rider, the durability is excellent in comparison to the contact-type mechanical switches using electric contacts. Further, the light emitting unit 12, the light receiving unit 13, and the determination unit 15 of the getting-on/off determination apparatus 10, which could otherwise easily receive adverse effects from dust, moisture, vibrations, electromagnetic waves, and the like, can be disposed in a place away from the optical switch of each of the step portions 24L and 24R and housed inside the ECU box 17 in which the durability is ensured. Furthermore, since the optical switch is connected to the light emitting unit 12 and the light receiving unit 13 through the optical fiber 11, which is less likely to be affected by the above-mentioned dust, moisture, vibrations, electromagnetic waves, and the like, its reliability and the wiring property can be improved even further. That is, it is possible to improve the durability of the getting-on/off determination apparatus 10.

Note that the present invention is not limited to the above-described exemplary embodiments, and modifications can be made as appropriate without departing from the spirit of the present invention.

Figure 9:
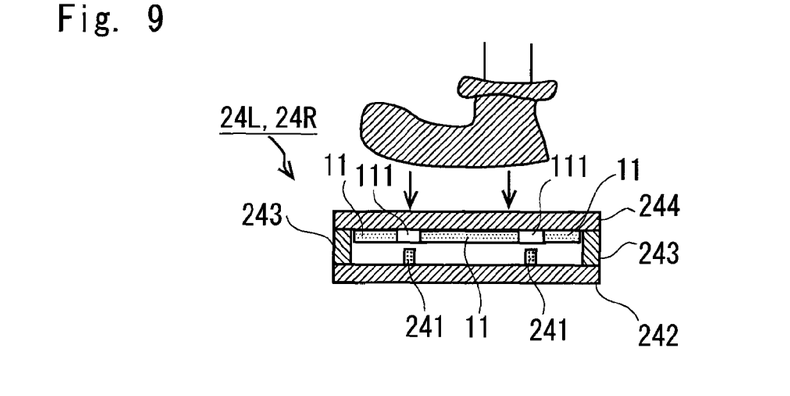
FIG. 9 is a cross section showing a modified example of a configuration of each step portion according to an exemplary embodiment of the present invention.

For example, although each convex portion 241 is disposed in the upper surface member 244 of each of the step portions 24L and 24R and the optical fiber 11 is laid in the lower surface member 242 in the above-described exemplary embodiments, the present invention is not limited to this configuration. For example, the optical fiber 11 may be laid on the under surface of in the upper surface member 244 and each convex portion 241 may be disposed on the upper surface of the lower surface member 242 in each of the step portions 24L and 24R (FIG. 9).

Figure 10:
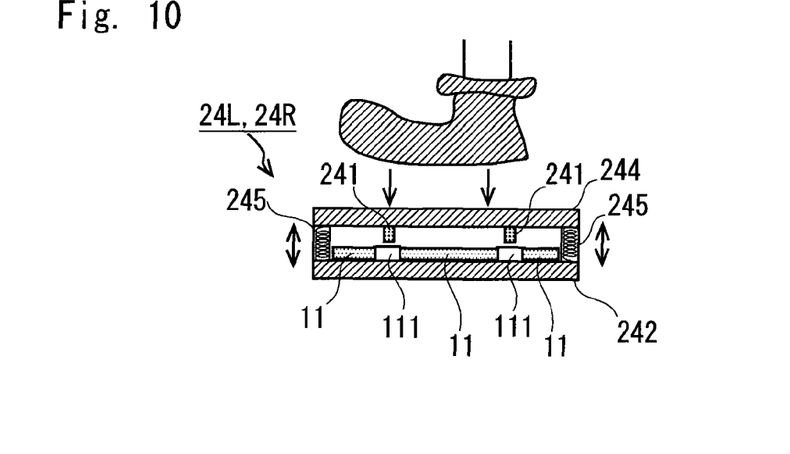
FIG. 10 is a cross section showing a modified example of a configuration of each step portion according to an exemplary embodiment of the present invention.

Further, in the above-described exemplary embodiments, the side member 245 may be constructed by an elastic body such as a spring member. By using the vertical expansion/contraction of the side member 245 that occurs when a rider gets on/off the inverted two-wheel vehicle, the upper surface member 244 is vertically displaced and each convex portion 241 thereby goes into/comes out from the respective space portion 111 of the optical fiber 11 (FIG. 10).

Figure 11:
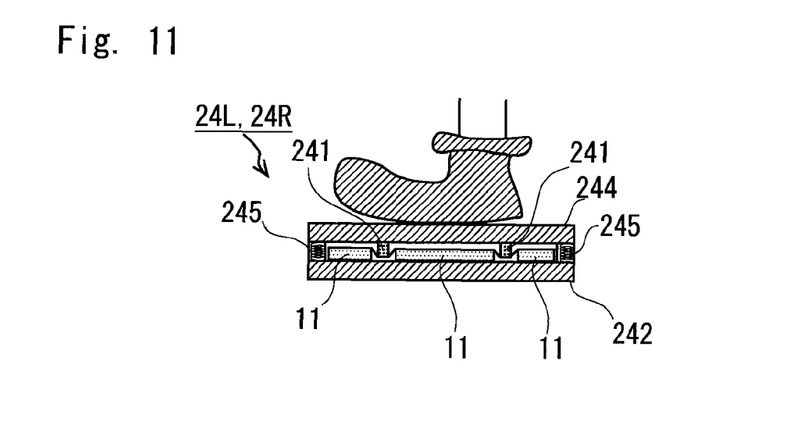
FIG. 11 is a cross section showing a modified example of a configuration of each step portion according to an exemplary embodiment of the present invention.

As shown in FIG. 11, when rider's foot is placed on the upper surface member 244 of each of the step portions 24L and 24R and a load is thereby applied on the upper surface member 244, each side member 245 contracts and each convex portion 241 of the upper surface member 244 thereby moves downward. As a result, each convex portion 241 goes into the respective space portion 111 of the optical fiber 11, and thereby reducing the amount of the detection light that passes through the optical fiber 11.

Further, in the above-described exemplary embodiments, the predetermined distance of the space portion 111 of the optical fiber 11 may be set to a larger value in order to reduce the elastic force of the elastic member 112 that is exerted as the convex portion 241 goes into the space portion 111. In this way, it is possible to reduce the force exerted on the elastic member 112, thus reducing the elastic fatigue and the like of the elastic member 112 and thereby increasing the durability.

Figure 12:
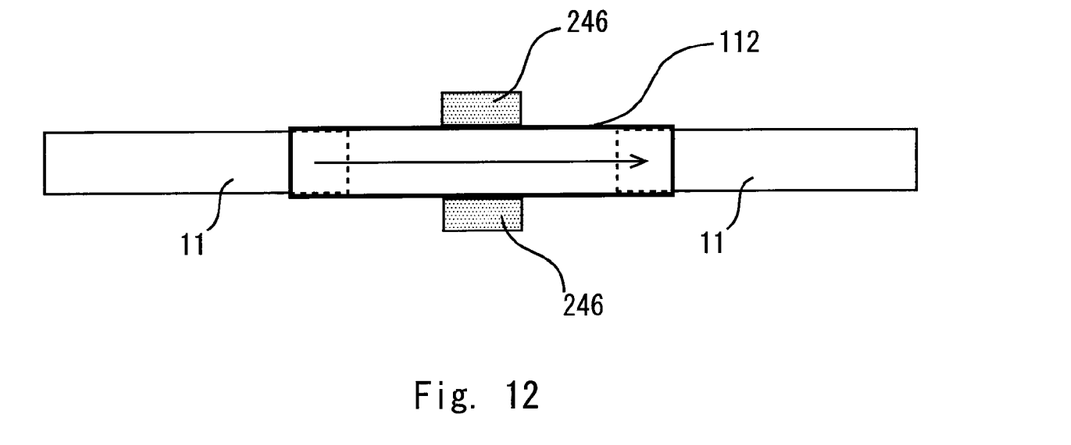
FIG. 12 is an enlarged view showing a modified example of each space portion of an optical fiber and each convex portion on an upper surface member of each step portion.

As shown in FIG. 12, for example, grasping members 246 that grasp the elastic member 112 may be used as the transmitted light varying portion 14 in such a manner that these grasping members 246 moves in conjunction with the vertical displacement of the respective step portion (24L, 24R).

Figure 13:
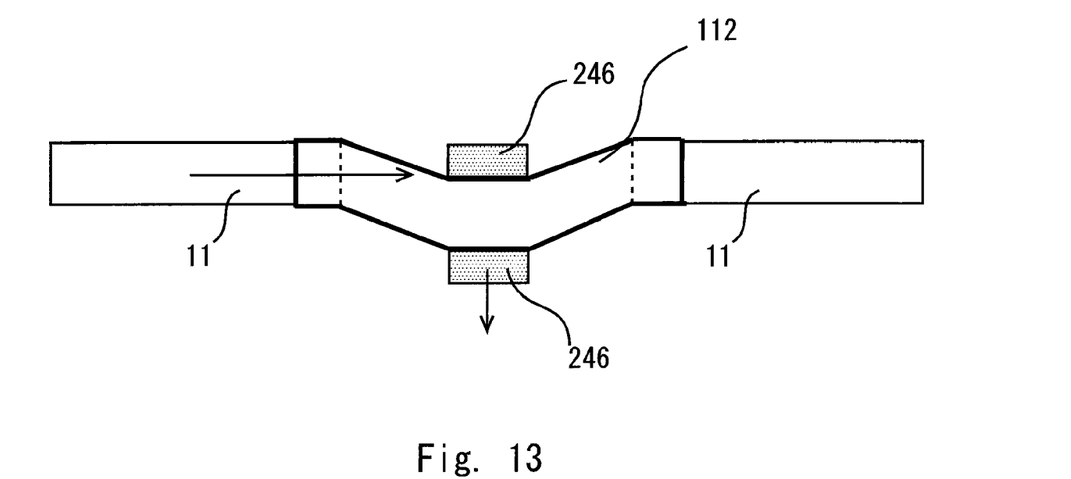
FIG. 13 is an enlarged view showing a modified example of each space portion of an optical fiber and each convex portion on an upper surface member of each step portion.

As shown in FIG. 13, when rider's foot is placed on the upper surface member 244 of each of the step portions 24L and 24R and a load is thereby applied on the upper surface member 244, the upper surface member 244 moves downward. Therefore, the grasping members 246 also move downwards in conjunction with the upper surface member 244. As a result, since the elastic member 112 bends downward and goes into the respective space portion 111, the elastic member 112 can reduce the amount of the detection light that passes through the optical fiber 11.

As described above, in this exemplary embodiment, any configuration can be used provided that each convex portion 241 goes into/comes out from the respective space portion 111 of the optical fiber 11 in conjunction with the vertical displacement of each of the step portions 24L and 24R that occurs when a rider gets on/off the inverted two-wheel vehicle and that the amount of the detection light that passes through the optical fiber 11 is thereby varied.

Although the present invention is explained as a hardware configuration in the above-described exemplary embodiments, the present invention is not limited to the hardware configuration. In the present invention, the above-described processes can be implemented by causing a CPU to execute a computer program.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.).

Further, the program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

Furthermore, the whole or part of the exemplary embodiments disclosed above can be described as, but not limited to, the following supplementary notes.

(Supplementary Note 1)

A getting-on/off determination apparatus that determines rider's getting-on/off for an inverted two-wheel vehicle that travels while maintaining an inverted state, including: an optical fiber laid in a step portion that a rider gets on/off; a light emitting unit that emits detection light, the light emitting unit being connected to one end of the optical fiber; a light receiving unit that receives the detection light emitted from the light emitting unit, the light receiving unit being connected to another end of the optical fiber; at least one transmitted light varying portion that varies an amount of transmitted light of the detection light that passes through the optical fiber in conjunction with a vertical displacement of the step portion that occurs when the rider gets on/off the inverted two-wheel vehicle; and a determination unit that determines getting-on/off of the rider based on an amount of the detection light received by the light receiving unit.

(Supplementary Note 2)

The getting-on/off determination apparatus according to Supplementary note 1, in which a plurality of space portions having a predetermined distance are formed in the optical fiber laid in the step portion, and each of the plurality of transmitted light varying portions goes into/comes out from the space portion in conjunction with a vertical displacement of the step portion that occurs when the rider gets on/off the inverted two-wheel vehicle and thereby varies the amount of transmitted light of the detection light.

(Supplementary Note 3)

The getting-on/off determination apparatus according to Supplementary note 2, in which: the step portion is provided in a vehicle main body as a pair of step portions each formed in a rectangular shape; the plurality of space portions are formed as a pair of front and rear space portions arranged in a longitudinal direction in each of the step portions; and the transmitted light varying portion is provided so as to correspond to the space portion.

(Supplementary Note 4)

The getting-on/off determination apparatus according to any one of Supplementary notes 1 to 3, in which: the step portion includes a lower surface member, a side member connected to the lower surface member, and an upper surface member that is connected to the side member and is displaced in a vertical direction when the rider gets on/off the inverted two-wheel vehicle; the transmitted light varying portion is a downward-protruding convex portion disposed on an under surface of the upper surface member of the step portion; the optical fiber is laid in the lower surface member; and the convex portion is formed in such a manner that the convex portion goes into/comes out from the space portion of the optical fiber in conjunction with a vertical displacement of the step portion.

(Supplementary Note 5)

The getting-on/off determination apparatus according to any one of Supplementary notes 2 to 4, in which the space portion of the optical fiber is covered with an elastic member.

(Supplementary Note 6)

The getting-on/off determination apparatus according to any one of Supplementary notes 2 to 5, in which the space portion of the optical fiber is filled with a resin member.

(Supplementary Note 7)

The getting-on/off determination apparatus according to Supplementary note 5, in which the transmitted light varying portion is a grasping member that is disposed in the upper surface member of the step portion and grasps the elastic member, and the grasping member bends the elastic member in a vertical direction in conjunction with a vertical displacement of the step portion.

(Supplementary Note 8)

A getting-on/off determination apparatus that determines rider's getting-on/off for an inverted two-wheel vehicle that travels while maintaining an inverted state, including: an optical fiber laid in a step portion that a rider gets on/off; light emitting means for emitting detection light, the light emitting means being connected to one end of the optical fiber; light receiving means for receiving the detection light emitted from the light emitting means, the light receiving means being connected to another end of the optical fiber; at least one transmitted light varying means for varying an amount of transmitted light of the detection light within the optical fiber in conjunction with a vertical displacement of the step portion that occurs when the rider gets on/off the inverted two-wheel vehicle; and determination means for determining getting-on/off of the rider based on an amount of the detection light received by the light receiving means.

(Supplementary Note 9)

A getting-on/off determination method to determine rider's getting-on/off for an inverted two-wheel vehicle that travels while maintaining an inverted state, including: a step of emitting detection light from one end of an optical fiber laid in a step portion that a rider gets on/off; a step of receiving the emitted detection light from another end of the optical fiber; a step of varying an amount of transmitted light of the detection light within the optical fiber in conjunction with a vertical displacement of the step portion that occurs when the rider gets on/off the inverted two-wheel vehicle; and a step of determining getting-on/off of the rider based on a received amount of the detection light.

The present invention is applicable to, for example, a getting-on/off determination apparatus that determines the getting-on/off of a rider for an inverted two-wheel vehicle that performs a desired traveling action while maintain the inverted state.

REFERENCE SIGNS LIST

1 INVERTED TWO-WHEEL VEHICLE
2 VEHICLE MAIN BODY
10 GETTING-ON/OFF DETERMINATION APPARATUS
11 OPTICAL FIBER
12 LIGHT EMITTING UNIT
13 LIGHT RECEIVING UNIT
14 TRANSMITTED LIGHT VARYING UNIT
15 DETERMINATION UNIT
24L, 24R STEP PORTION
241 CONVEX PORTION
242 LOWER SURFACE MEMBER
243 SIDE MEMBER
244 UPPER SURFACE MEMBER

The invention claimed is:

1. A getting-on/off determination apparatus that determines rider's getting-on/off for an inverted two-wheel vehicle that travels while maintaining an inverted state, comprising:
   an optical fiber laid in a step portion that a rider gets on/off;
   a light emitting unit that emits detection light, the light emitting unit being connected to one end of the optical fiber;
   a light receiving unit that receives the detection light emitted from the light emitting unit, the light receiving unit being connected to another end of the optical fiber;
   a plurality of transmitted light varying portion that varies an amount of transmitted light of the detection light that passes through the optical fiber in conjunction with a vertical displacement of the step portion that occurs when the rider gets on/off the inverted two-wheel vehicle; and a determination unit that determines getting-on/off of the rider based on an amount of the detection light received by the light receiving unit, wherein a plurality of space portions are provided in the optical fiber laid in the step portion, the plurality of space portions being formed by severing the optical fiber in such a manner that ends of the severed optical fiber are spaced by a predetermined distance, each of the plurality of transmitted light varying portions goes into/comes out from the space portion in conjunction with a vertical displacement of the step portion that occurs when the rider gets on/off the inverted two-wheel vehicle and thereby varying the amount of transmitted light of the detection light, the light emitting unit, the light receiving unit, and the determination unit are housed inside a box, which is hermitically sealed and located in a place away from the transmitted light varying portion and the space portion, the step portion is provided in a vehicle main body, the plurality of space portions are formed in a longitudinal direction in the step portion, and the transmitted light varying portion is provided so as to correspond to the space portion.

2. The getting-on/off determination apparatus according to claim 1, wherein:

the step portion includes a lower surface member, a side member connected to the lower surface member, and an upper surface member that is connected to the side member and is displaced in a vertical direction when the rider gets on/off the inverted two-wheel vehicle;

the transmitted light varying portion is a downward-protruding convex portion disposed on an under surface of the upper surface member of the step portion;

the optical fiber is laid in the lower surface member; and the convex portion is formed in such a manner that the convex portion goes into/comes out from the space portion of the optical fiber in conjunction with a vertical displacement of the step portion.

3. The getting-on/off determination apparatus according to claim 1, wherein the space portion of the optical fiber is covered with an elastic member.

4. The getting-on/off determination apparatus according to claim 1, wherein the space portion of the optical fiber is filled with a resin member.

5. The getting-on/off determination apparatus according to claim 3, wherein the transmitted light varying portion is a grasping member that is disposed in the upper surface member of the step portion and grasps the elastic member, and the grasping member bends the elastic member in a vertical direction in conjunction with a vertical displacement of the step portion.

6. A getting-on/off determination apparatus that determines rider's getting-on/off for an inverted two-wheel vehicle that travels while maintaining an inverted state, comprising:

an optical fiber laid in a step portion that a rider gets on/off;

light emitting means for emitting detection light, the light emitting means being connected to one end of the optical fiber;

light receiving means for receiving the detection light emitted from the light emitting means, the light receiving means being connected to another end of the optical fiber;

a plurality of transmitted light varying means fort varying an amount of transmitted light of the detection light within the optical fiber in conjunction with a vertical displacement of the step portion that occurs when the rider gets on/off the inverted two-wheel vehicle; and determination means for determining getting-on/off of the rider based on an amount of the detection light received by the light receiving means, wherein a plurality of space portions are provided in the optical fiber laid in the step portion, the plurality of space portions being formed by severing the optical fiber in such a manner that ends of the severed optical fiber are spaced by a predetermined distance, each of the plurality of transmitted light varying means goes into/comes out from the space portion in conjunction with a vertical displacement of the step portion that occurs when the rider gets on/off the inverted two-wheel vehicle and thereby varying the amount of transmitted light of the detection light, the light emitting means, the light receiving means, and the determination means are housed inside a box, which is hermitically sealed and located in a place away from the transmitted light varying means and the space portion, the step portion is provided in a vehicle main body, the plurality of space portions are formed in a longitudinal direction in the step portion, and the transmitted light varying portion is provided so as to correspond to the space portion.

7. A getting-on/off determination method to determine rider's getting-on/off for an inverted two-wheel vehicle that travels while maintaining an inverted state, comprising:

emitting detection light from one end of an optical fiber laid in a step portion that a rider gets on/off;

receiving the emitted detection light from another end of the optical fiber;

varying an amount of transmitted light of the detection light within the optical fiber in conjunction with a vertical displacement of the step portion that occurs when the rider gets on/off the inverted two-wheel vehicle;

determining getting-on/off of the rider based on a received amount of the detection light, wherein the light emitting unit that emits the detection light, the light receiving unit that receives the detection light, and the determination unit that determines the getting on/off are housed inside a box, which is hermitically sealed and located in a place away from a transmitted light varying portion that varies the amount of transmitted light, the step portion is provided in a vehicle main body, the plurality of space portions are formed in a longitudinal direction in the step portion, and the transmitted light varying portion is provided so as to correspond to the space portion.

* * * * *